United States Patent [19]

Lee et al.

[11] Patent Number: 5,429,979
[45] Date of Patent: Jul. 4, 1995

[54] METHOD OF FORMING A DRAM CELL HAVING A RING-TYPE STACKED CAPACITOR

[75] Inventors: Daniel Hao-Tien Lee, Hsinchu; Chao-Ming Koh; Yu-Hua Lee, both of Hsin-chu, all of Taiwan, Prov. of China

[73] Assignee: Industrial Technology Research Institute, Hsinchu, Taiwan, Prov. of China

[21] Appl. No.: 274,415

[22] Filed: Jul. 13, 1994

[51] Int. Cl.6 .................... H01L 21/70; H01L 27/00
[52] U.S. Cl. ........................... 437/52; 437/60; 437/919
[58] Field of Search ............ 437/47, 52, 60, 919, 437/; 257/304–308, 311

[56] References Cited

U.S. PATENT DOCUMENTS 5,068,199  11/1991  Sandhu ................... 437/52
5,084,405  1/1992  Fazan et al. ............ 437/52
5,192,702  3/1993  Tseng .................... 437/47
5,326,714  7/1994  Liu et al. ............... 437/47

*Primary Examiner*—O. Chaudhuri
*Assistant Examiner*—H. Jey Tsai
*Attorney, Agent, or Firm*—George O. Saile

[57] ABSTRACT

A new method for fabricating a storage capacitor, on a dynamic random access memory (DRAM) cell, having a ring-type sidewall was accomplished. The method involves opening the self-aligned node contact to the source/drain area of the field effect transistor and forming the bottom capacitor electrode. The same photoresist mask used to open the self-aligned node contact is later used to mask and partially etch the polysilicon bottom capacitor electrode to form the ring-type sidewall on the bottom electrode. The storage capacitor is then completed by forming a thin capacitor dielectric and depositing the top electrode. The method provides a simple process that increases the capacitance of the storage capacitor by about 40 percent while not adversely affecting the leakage current.

22 Claims, 3 Drawing Sheets

5,429,979

METHOD OF FORMING A DRAM CELL HAVING A RING-TYPE STACKED CAPACITOR

BACKGROUND OF THE INVENTION (1) Field of the Invention

The present invention relates to the fabrication of a dynamic random access memory (DRAMs) device, and more particularly, a fabrication technique for making a ring-type stacked storage capacitor used for charge storage.

(2) Description of the Prior Art

Very large scale integration (VLSI) technologies have greatly increased the circuit density on the chip, and have significantly improved the circuit performance and reduced the cost of todays electronic products. One type of VLSI chip, the dynamic random access memory (DRAMs), is used extensively in the electronic industry and particularly in the computer industry for electrical data storage. These DRAM chips consist of a large array of individual cells, each cell storing a unit of data (one bit) on a capacitor as charge. A single cell is composed of one charge passing transistor, usually a field effect transistor (FET), and a single storage capacitor. In the next 5 to 10 years the number of these cells, on a chip, expected to reach 256 megabits per chip. To achieve these advances in data storage and maintain a reasonable chip size, the individual memory cells, on the chip, must be significantly reduced in size.

As these individual memory cells decrease in size, so must the MOSFET charge passing transistor and the storage capacitor. However, the reduction in the storage capacitor size makes it difficult to store sufficient charge on the capacitor to maintain an acceptable signal-to noise level. Also, these smaller storage capacitors require shorter refresh cycle times to retain the necessary charge level.

These storage capacitor are either formed in the substrate as trench capacitors or as a stacked capacitor on the substrate, usually over the cell area containing the field effect transistor. The stacked capacitor has received much interest in recent years because of the variety of ways that the capacitor can be extended upward over the cell area, increasing its capacitance without requiring additional area on the substrate.

However, these vertical extending capacitors usually require additional processing steps that complicate further the process and increases the cost. For example, P. Fazan in U.S. Pat. No. 5,084,405 teaches a method of depositing a polysilicon layer over an insulating template and then etching back to form a polysilicon sidewall extending upward on the capacitor bottom electrode. Another approach is described by H. H. Tseng in U.S. Pat. No. 5,192,702 in which a self-aligning mask is formed from sidewall spacers, thermal oxidation and the likes are used to etch vertical sidewall in a polysilicon capacitor electrode. Alternatively, non self-aligned vertical walls can also be formed by conventional photolithographic techniques and plasma etching using additional special designed masks.

Although current fabrication methods, of varying complexity, provide a means for fabricating stacked capacitors with increased capacitance, there is still a strong need for processes that minimizes the process complexity while providing good yields at low cost.

SUMMARY OF THE INVENTION

It is a principle object of this invention to provide a method for forming a stacked storage capacitor electrode having a ring-type vertical sidewall using the self-aligning contact mask from the DRAM chip mask set to also form the ring-type vertical sidewall on the capacitor electrode.

It is another object of this invention to provide a method for making a stacked storage capacitor with substantially increased capacitance and without increasing the area of the DRAM cell, while minimizing the process steps and thereby providing a cost effective product.

The method begins by selectively forming on a semiconductor substrate, such as single crystal silicon substrate, a thick field oxide that surrounds and isolates device areas on the substrate in and on which the field effect transistors are to be built. A gate oxide is formed in the device areas and then a doped first polysilicon layer usually having a first insulating layer composed of silicon oxide or silicon oxide/silicon nitride formed thereon is patterned. Portions of this patterned polysilicon layer form the gate electrodes for the transistors over the device areas and other portions form part of the interconnecting wiring, usually called word lines, over the field oxide. Two source/drain areas are formed adjacent to and one on each side of the gate electrode of each transistor. Insulating sidewall spacers are then formed on the gate electrodes. Next, a second insulating layer, composed of silicon oxide is deposited on the substrate and a self-aligning contact mask and etching are us&d to make contact openings in the second insulating layer to one of the two source/drain areas of each transistor making up the DRAM cell.

A relatively thick second polysilicon layer is deposited over the substrate and patterned by etching to form the bottom capacitor electrodes of the stacked storage capacitors which make contact to the source/drain areas having the contact openings. The self-aligning contact mask is then used a second time to expose and develop a photoresist pattern having openings aligned to and over the bottom capacitor electrodes. Using the photoresist as an etch mask the bottom electrodes are anisotropically etched a second time to partially etch the bottom capacitor electrodes composed of the second polysilicon layer and thereby form recesses in the electrodes. This provides a bottom electrode having a ring-type vertical sidewall having about 40% larger area than a conventional electrode.

The bottom capacitor electrodes are formed from an in situ doped second polysilicon layer, alternatively, the polysilicon layer can be deposited undoped and then doped by implantation with N-type impurities, such as arsenic or phosphorus ions, thereby providing an ohmic contact to the source/drain and making the bottom capacitor electrodes and ringed sidewalls more electrically conducting. A relatively thin capacitor dielectric layer, such as silicon oxide-silicon nitride-silicon oxide (ONO) is formed completely covering the surface of the bottom capacitor electrodes. An N-type doped third polysilicon layer is then deposited and patterned by photolithographic techniques and plasma etching to define the top electrode and complete the stacked capacitor of this invention.

The DRAM chip is then completed by depositing a planarizing third insulating layer, such as BPSG, over the substrate and forming openings to the second source/drain area of each field effect transistor (FET) and providing a second interconnecting metallurgy to form the bit line. This bit line wiring is then formed from a fourth polysilicon layer that has a silicide formed on the surface, such as tungsten silicide. The polysilicon/silicide layer is then patterned using conventional photolithographic techniques and plasma etching to complete the interconnection.

BRIEF DESCRIPTION OF THE DRAWINGS

The object and other advantages of this invention are best explained in the preferred embodiment with reference to the attached/drawing that include.

DESCRIPTION OF THE PREFERRED EMBODIMENTS

Now in keeping with the objects of the invention, the method for forming the self-aligned storage capacitor having ring-type sidewalls is covered in detail. This capacitor can be fabricated on field effect transistors (FETs) structures that are currently used in the manufacture of DRAMs. Therefore, only those details of the underlying structure will be described that are necessary for understanding the current invention.

Figure 1:
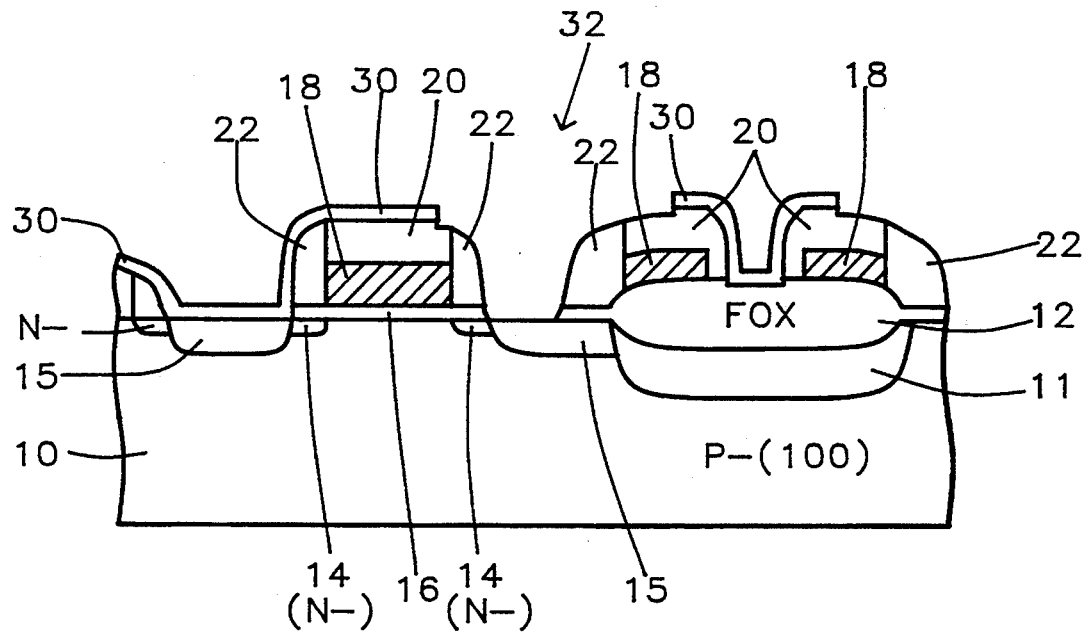
FIGS. 1 through 4 illustrate schematically the cross-section representation of a DRAM cell having a charge storage capacitor and a FET as the charge passing transistor. The FIGS. 1 through 4 follow the process flow in the preferred embodiment for making the self aligning capacitor contact and the ring-type bottom electrode of the stacked capacitor.

Referring now to FIG. 1, a cross-sectional view of the substrate 10, with a FET structure built on its surface, is shown schematically. The preferred substrate is composed of a P type single crystal silicon with a <100> crystallographic orientation. A thick Field OXide 12 (FOX), for isolating the device, is first formed surrounding the region where the device is to be built. A portion of which is shown in FIG. 1. Briefly, the method commonly practiced in the industry is to use a thin thermal oxide (pad oxide) and a silicon nitride layer as an oxidation resistant mask. The desired field oxide regions are etched open in the oxide/nitride layer using conventional photolithographic techniques and a field oxide is thermally grown, typically to a thickness of about 4500 to 5500 angstroms. It is common practice to form a channel stop 11 by implantation before forming the field oxide. This is generally done to prevent surface inversion and thereby leakage currents from occurring.

The semiconductor devices are then fabricated on the silicon surface in the non-oxidize areas, after removing the silicon nitride layer using a wet etch. For example, using a solution of heated phosphoric acid ($H_3PO_4$). For the DRAM cell the typical transistor used is a field effect transistor (FET) having a polysilicon gate electrode and is now briefly described. The silicon surface is first carefully cleaned and a good quality thermal oxide is grown to form the gate oxide 16. The preferred thickness is between about 80 to 200 Angstroms. Next, the gate electrode structure is formed by depositing a first polysilicon layer 18, for example, using a low pressure chemical vapor deposition (LPCVD) deposition. The preferred thickness is usually in the range from 1000 to 4000 Angstroms. After the first polysilicon layer is appropriate doped, a first insulating layer 20, composed of silicon oxide or alternatively silicon oxide and silicon nitride, is then deposited on the first polysilicon layer. The gate structure is then formed from the first polysilicon layer with a first insulating layer on top by anisotropic etching in a low pressure plasma etcher using an appropriate etch gas mixture for each layer. Conventional photolithographic technique are used for defining the etch mask.

The next step is to form the lightly doped source/drain 14, of the N-channel FET. This doping is usually accomplished by implanting a N-type species, such as arsenic or phosphorous. For example, a typical implantation might consist of a phosphorous $p^{31}$ at a dose of between 1 to 10 E 13 atoms/$cm^2$ and with an energy of about 30 to 80 Kev. As known by one skilled in the art, a photoresist masking can be used to avoid implanting in areas not requiring the implant.

After forming the lightly doped source/drain, side wall spacers 22 are formed on the gate electrode structure. These spacers are formed by depositing a blanket conformal layer of a low temperature silicon oxide on the substrate and using an anisotropic etch to etch back to the source/drain surface. For example, the silicon oxide can be a chemical vapor deposition using tetraethoxysilane (TEOS) at a temperature in the range of about 650° to 900° C., and the etch back can be accomplished with a reactive plasma etcher of various design and using an appropriate gases mixture. For example, the etching can be performed in a gas mixture such as carbon tetrafluoride and hydrogen ($CF_4/H_2$) or a gas mixture containing trifluoromethane ($CHF_3$).

Typically the source/drain contacts areas 15 are formed next by implantation to complete the FET, such as by implantation of arsenic ions ($As^{75}$) with a dose of between about 2 E 15 to 1 E 16 atoms/$cm^2$ and an ion energy of between about 20 to 70 KeV. Alternatively, depending on the process, the ohmic contacts to the source/drain can be achieved at a later process set by out diffusion, such as from a doped polysilicon layer.

Although this embodiment specifically describes the fabrication of a DRAM cell using an N-channel FET, it should be well understood by those skilled in the art that P-channel FETs can also be formed on the substrate. For example, by providing N-well in the P doped substrate and by reversing the dopant type it is possible to fabricate P-channel FET and to form CMOS circuits therefrom.

The remainder of this embodiment relates more particularly to the objects of this invention which now describes in detail the formation of the stacked storage capacitor. And more specifically to the fabrication of the bottom electrode of the storage capacitor having a self-aligned node contact and a ring-type sidewall. The ring-type sidewall on the bottom capacitor electrode is formed using the same mask that is used to open the self-aligning contact to the source/drain area of the FET for making the capacitor node contact.

Referring still to FIG. 1, the capacitor structure is fabricated by depositing a second insulating layer 30 composed of silicon oxide. The preferred process for the silicon oxide layer 30 is a deposition in a low pressure chemical vapor deposition (LPCVD) process reactor using, for example, tetraethoxysilane (TEOS), at a preferred temperature range of between about 650° to 900° C. and having a preferred thickness in the range from about 1000 to 3000 Angstroms.

Also shown in FIG. 1, a self-aligned contact opening 32 is now formed in the second insulating layer 30 to one of the two source/drain contact of the FET that is selected as the node contact of the storage capacitor. Conventional photolithographic techniques and anisotropic plasma etching are used to form the opening, and as shown in FIG. 1, the contact opening is etched to the first insulating layer 20 exposing the source/drain area 15 and the sidewall spacers 22. This provides a means for self-aligning the contact to the gate electrode 18 by utilizing the sidewall spacers.

Figure 2:
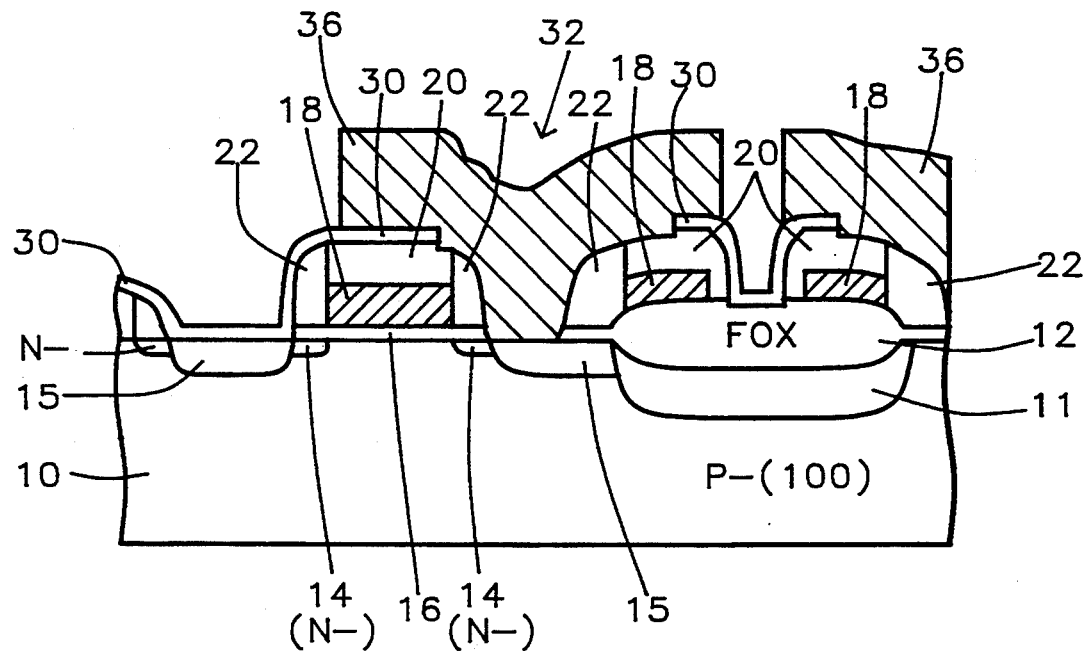

Now referring to FIG. 2, a second polysilicon layer 36 is deposited on the substrate over the device areas and the field oxide areas. This layer is patterned to form the bottom electrode of the stacked capacitor. The preferred deposition is an undoped polysilicon layer and in a low pressure chemical vapor deposition (LPCVD) reactor, for example, using a reaction gas such as silane at a process temperature of about 570° C. and a pressure of about 200 mTorr. The preferred thickness of layer 36 being between about 3000 to 5000 Angstroms and more specifically having a thickness of 5000 Angstroms. The second polysilicon layer 36 is then patterned to form the bottom electrode of the DRAM cell making contact to the source/drain area 15 via contact opening 32. A conventional lithography and etching are used to patterning layer 36 by anisotropically etching to the layer 30, thereby forming an array of bottom electrodes physically and electrically isolated from each other.

Figure 3:
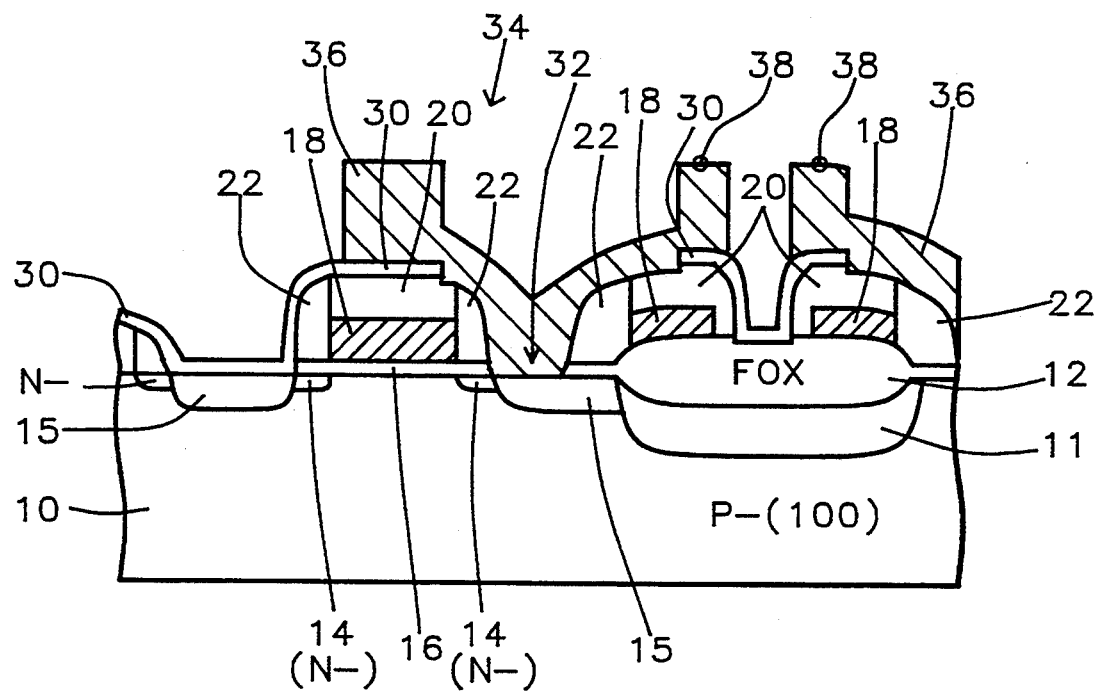

The bottom capacitor electrodes formed from layer 36 are now patterned a second time using the same self-aligning contact mask, previously used to open the contact opening 32. Conventional lithography is used to mask the substrate leaving open areas over and aligned to the bottom electrodes and then anisotropic etching is used to partially remove the polysilicon forming the recess 34, as shown in FIG.3. The cross section of the partially completed DRAM structure, shown in FIG.3, is after the photoresist is removal. As seen, this results in the ring-type sidewalls on the bottom electrode which increases the area of the bottom capacitor electrode. The etching is typically carried out at low pressure in a reactive ion etcher having, for example, a gas mixture such as carbon tetrafluoride ($CF_4$) and hydrogen bromide (HBr). The etching is performed as a timed etch and the preferred depth of the recess is determined by the desired increase in capacitance. By way of example only, for the DRAM cell structure of this embodiment if the bottom electrode or plate is about 5000 Angstroms thick and the recess is etched to depth of about 4000 Angstroms, then there is an increase of about 37.5 percent in the electrode area with a corresponding increase in capacitance. More detailed calculation of the capacitance are given in TABLES 1 and experimental results on measured capacitance and leakage currents are given in TABLE 2 in the EXAMPLE.

Continuing with the description of the embodiment of this invention, the bottom capacitor electrode formed from layer 36 is now doped with N-type impurity, such as with arsenic or phosphorus atoms. This is usually done to increase the conductivity of the electrode and to provide for a good ohmic contact to the source/drain area. The preferred doping method is by depositing an in situ doped polysilicon layer, such as by LPCVD and adding phosphine ($PH_3$) to the CVD reactant gas ($SiH_4$). The preferred dopant concentration being in the range of between about 1 E 19 to 1 E 21 atoms/$cm^3$. Alternatively, the polysilicon layer 36 can be deposited undoped an then implanted, for example, having a dose of between about 1 E 15 to 5 E 15 atoms/$cm^3$ and at an ion implant energy of between about 50 to 100 KeV.

The capacitor dielectric layer is now formed over the bottom electrode composed of the second polysilicon layer 36. This very thin layer is indicated by the number 38 in FIG. 3 as being on the surface of layer 36. Layer 38 is typically composed of silicon oxide, silicon nitride and silicon oxide (ONO). This dielectric layer 38 is usually formed by oxidizing the surface of the polysilicon layer 36 to form a very thin native oxide and then depositing a silicon nitride layer, for example by LPCVD wherein the gas mixture is ammonia and $SiH_2Cl_2$ and the resulting thickness is about 55 Angstroms. The silicon nitride layer is then treated in an oxygen ambient at an elevated temperature to convert the silicon nitride surface to an oxide. The preferred thickness of the ONO layer 38 having an effective oxide thickness of between about 50 to 80 Angstroms and more specifically an effective oxide thickness of about 55 Angstroms.

Figure 4:
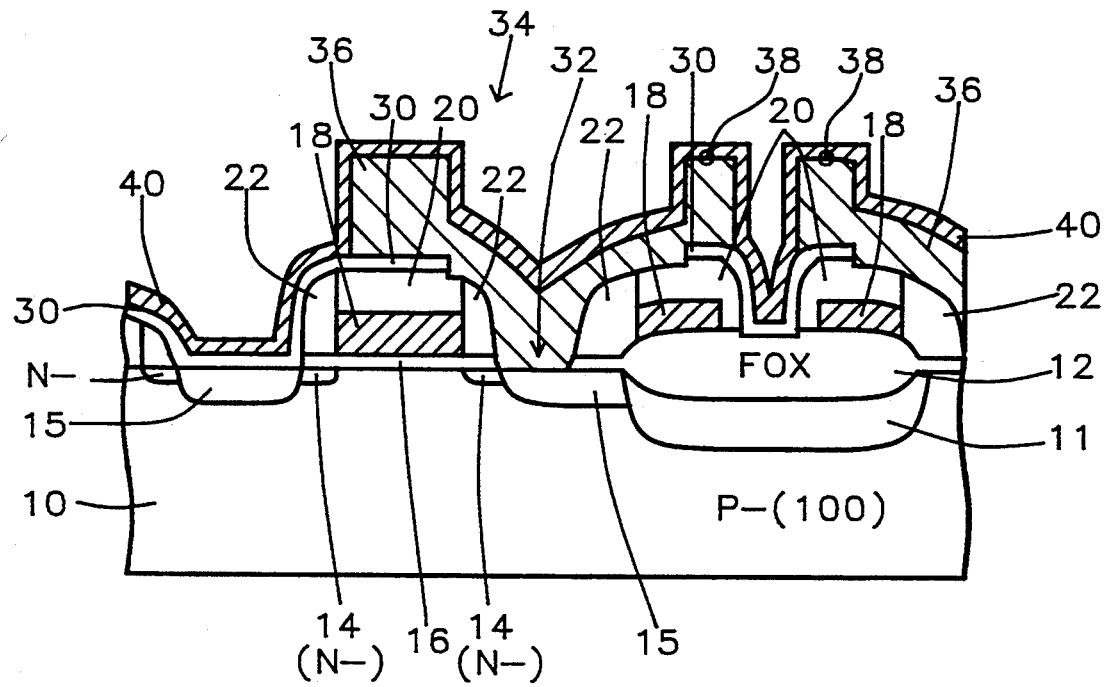

As shown now in FIG. 4, a third polysilicon layer 40, is then deposited over the thin capacitor dielectric layer 38 to complete the capacitor structure. The top polysilicon layer 40 is also doped with an N type impurity either by depositing an in situ doped polysilicon layer or by implanting a undoped polysilicon layer to increase its electrical conductivity. The dopant species, for example can be phosphorous, and the preferred concentration in the polysilicon layer 40 is in a range of between about 1 E 19 to 1 E 21 atoms/$cm^3$.

Figure 5:
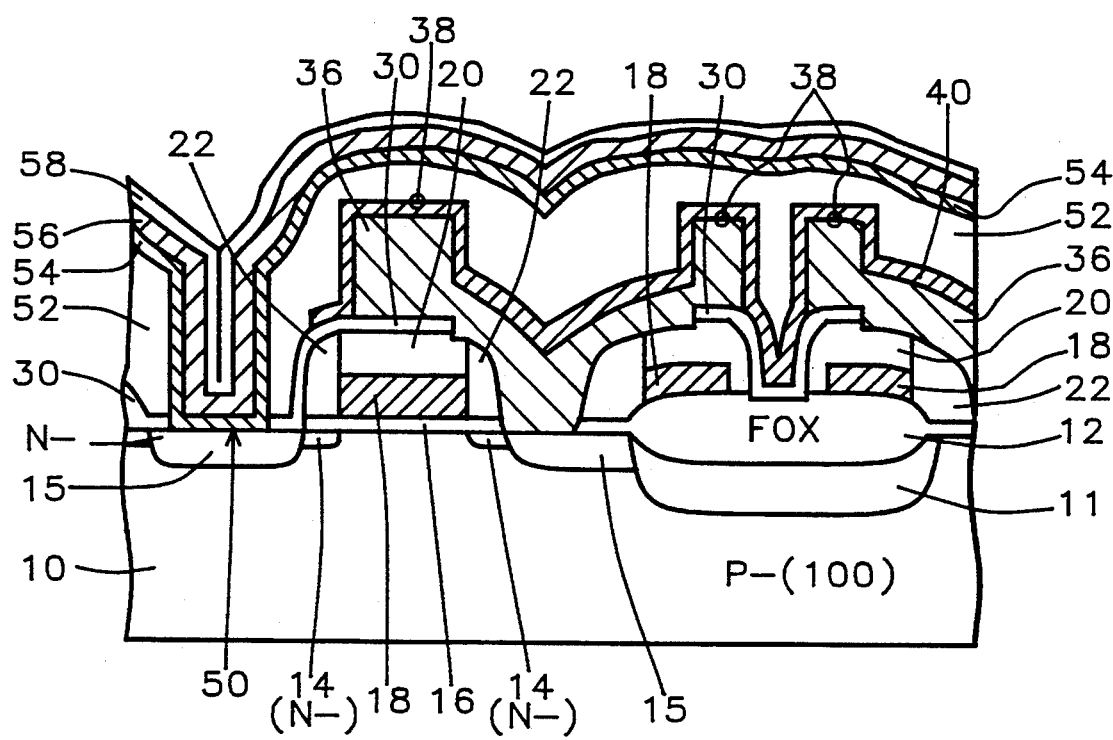
FIG. 5 shows the completed cell structure up to and including the polysilicon or silicide bit line and the over laying insulation.

Now referring to FIG. 5, the schematic shows a cross-sectional view of a completed DRAM structure having this new ring-type capacitor structure. The top polysilicon layer 40 is now patterned by conventional lithography and plasma etching so as to form the top capacitor electrode and to provide open areas over the bit line contact 50. Next a third insulating layer 52, such as borophososilicate glass (BPSG) is deposited and annealed to form a planar insulating surface and to support the bit line wiring. The preferred thickness of layer 52 being in the range of between about 3000 to 5000 Angstroms. The bit line contact mask and an appropriate photolithographic process is then used to open the bit line contact in the BPSG insulation 52 and the first insulating layer 30 to the bit line contact at 50. A fourth polysilicon layer 54 is deposited to form the bit line metallurgy having a thickness of between about 500 to 1500 Angstroms. The layer 54 is then doped N type, for example, by in situ doping or implanting with arsenic or phosphorous ions. The substrate is then annealed to drive in the N type dopant to form the appropriate ohmic contact in the bit line contact region 50. A silicide layer 56 is then formed on the polysilicon layer 54 such as a tungsten silicide ($WSi_2$) to increase its conductivity. The preferred method is the deposition of a metal layer followed by a low temperature alloying anneal. The preferred silicide being tungsten silicide (WSi). The WSi bit line wiring is now patterned using photolithographic techniques and a reactive ion etching process, and then a sixth insulating layer 58, for example composed of a barrier oxide layer, such as CVD silicon oxide and a BPSG layer, is deposited and anneal at elevated temperature to further planarize the surface and complete the dynamic random access memory (DRAM) cell.

The following Examples are given to show some of the important features and benefit of the invention and as an aid in better understanding the invention.

EXAMPLES

The Example in Table 1 shows the result of a calculation of the area of the ring-type capacitor of this invention compared to the area of a standard capacitor. The increase in capacitance of the ring-type capacitor over the standard capacitor is clearly shown.

TABLE 1

Calculated Capacitance for Ring-Type vs Standard Capacitor

| Type Capacitor | Polysilicon etch depth (Angstroms) 1. | Capacitor total area (micrometers$^2$) 2. | Capacitance (femtoFarads) 3. |
| --- | --- | --- | --- |
| 1) ring type | 4000 | 5.19 | 32.59 |
| 2) ring type | 2000 | 4.51 | 28.32 |
| 3) standard | not etched | 3.83 | 24.04 |

A standard capacitor with a bottom electrode, or node plate having a thickness of 5000 Angstroms, as shown in row 3 is compared to a ring-type capacitor having a bottom electrode with the same thickness, but with the ring-type sidewall having two different heights, one of 2000 Angstroms, as shown in row 2, and the other for 4000 Angstroms, as shown in row 1. The area for the standard capacitor is about 3.83 square micrometers (um2), as shown in row 3 column 2, while ring-type capacitor having the 4000 Angstrom recess is about 5.19 um$^2$, as shown in row 1, column 2. The increase in area resulting from this invention is about 35.5 percent. Likewise, the increase in capacitance, due to the increase in area, for the ring-type capacitor is from about 24.04 femtoFarads (fF) for the standard capacitor, without the recess, to about 32.59 fF with the 4000 Angstrom recess, as shown respectively in rows 3 and 1 of column 3. The ring-type capacitor results in a 35.5 percent increase in capacitance. The effective capacitor dielectric thickness in both cases was taken to be 55 Angstroms The calculation of the capacitance was performed using the standard capacitor equation, $$C = e_0 K A / d.$$

Where C is the capacitance in Farads, $e_0$ is the absolute permittivity of free space (Vacuum) and has a constant value of $8.854 \times 10^{-12}$ Farads/meter, K is the relative permittivity of the dielectric and was assigned the value of 3.9 for this Example, and d is the distance between the capacitor electrode and is equal to the thickness of the dielectric. The distance d was taken to be $55 \times 10^{-10}$ meters (55 Angstroms) in this Example. For example, the area A for the standard capacitor was calculated to be 3.83 micrometers$^2$, as shown in row 3, column 2 and the capacitance computes to about $24.04 \times 10^{-15}$ Farads (24.04 femtoFarads) as shown in row 3, column 3.

Now referring to Table 2 in the Example, the electrical measurements of the capacitance and the leakage current are shown for both types of capacitors. The test structures where built using the method of this invention and using the standard process.

TABLE 2

Electrically Measured Capacitance and Leakage Currents for Ring and Standard Type Capacitor

| type capacitor | standard capacitor | | ring-type cap. | |
| --- | --- | --- | --- | --- |
| sample | #1 | #2 | #3 | #4 |
| 1) capacitance 1 E 6 cap. (nanoFarads) | 24.0 | 23.1 | 28.1 | 29.4 |
| leakage current (picoAmpere) | | | | |
| 2) 1,000,000 cells | 282.0 | 265.0 | 246.0 | 700.0 |
| 3) 250,000 cells | 177.0 | 176.0 | 183.0 | 152.0 |
| 4) 1,000 cells | 1.8 | 1.1 | 1.5 | 1.5 |

As can be seen in Table 2, the capacitance for one million capacitors is parallel, as is shown in the row 1, the results are in good agreement with Table 1 for the 2000 Angstrom recessed capacitor and the standard capacitor. The capacitance measured on the 1,000,000 capacitors being about 23.1 to 24 nanoFarads (nF) for the standard capacitor and about 28.1 to 29.4 (nF) on the ring-type capacitor. The increase in capacitance being about 20 percent, which is in reasonable agreement with the value in Table 1 for the 2000 Angstrom capacitor. The increase between the 2000 Angstrom capacitor and the standard capacitor in Table 1 being about 18 percent.

Also shown in Table 2 is the measured leakage current at 2 volts for test structures built by the standard and the ring-type capacitor process and having 1,000,000, 256,000 and 1000 cells. As is shown in Table 2, rows 2, 3 and 4, the leakage currents are comparable for both types of capacitors and thereby, indicating that there is no significant degradation in the retention time for the ring-type capacitor of samples 3 and 4, compared to the standard capacitors of samples 1 and 2.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a high capacitance stacked capacitor on a semiconductor substrate having a device areas formed therein and a field oxide elsewhere on said substrate, comprising the steps of:

providing a field effect transistor structure in and on said device area on said semiconductor substrate;

said field effect transistor having a gate electrode patterned from a first polysilicon layer with a first insulating layer and insulating sidewall spacers thereon and having source/drain areas in and on said device area and adjacent to said gate electrode;

depositing a second insulating layer on said device areas and elsewhere over said substrate;

using a photoresist mask and etching self-aligning contact openings in said second insulating layer to one of two said source/drain areas of said field effect transistor;

depositing a second polysilicon layer on said substrate and contacting said source/drain in said opening;

patterning said second polysilicon layer having portions remaining over said self-aligned contact and forming a bottom capacitor electrode making contact to said source/drain area;

using said same photoresist mask of said contact openings to pattern and partially etch said bottom capacitor electrode forming ring-type sidewalls on said bottom capacitor electrode;

doping with impurities said bottom capacitor electrode by implantation and thereby increasing the conductivity and forming ohmic contact to said source/drain area;

forming a capacitor dielectric layer on surface of said bottom capacitor electrode;

depositing a third polysilicon layer on said substrate and patterning to form a top capacitor electrode and completing said stacked capacitor.

2. The method of claim 1, wherein the thickness of said first polysilicon is between about 1000 to 3000 Angstroms.

3. The method of claim 1, wherein said first insulating layer is silicon oxide formed from a tetraethoxysilane (TEOS) having a thickness of between about 1000 to 2500 Angstroms.

4. The method of claim 1, wherein said second insulating layer is a silicon oxide formed from a tetraethoxysilane (TEOS) and having a thickness of between about 1000 to 3000 Angstroms.

5. The method of claim 1, wherein said self-aligned contact openings are formed using a photoresist mask and anisotropic etching said second insulating layer to said first insulating layer and said sidewall spacers.

6. The method of claim 1, wherein the thickness of said second polysilicon layer is between about 3000 to 5000 Angstroms.

7. The method of claim 1, wherein said bottom capacitor electrode ring-type sidewall is formed by partially and anisotropically etching said second polysilicon layer to a depth of between about 1000 to 4000 Angstroms.

8. The method of claim 1, wherein said capacitor dielectric layer is composed of silicon oxide/silicon nitride/silicon oxide (ONO) having a thickness in the range from about 50 to 80 Angstroms.

9. The method of claim 1, wherein said bottom capacitor electrode composed of said second polysilicon layer is doped N type having a concentration of between about 1 E 19 to 1 E 21 atoms/cm$^3$.

10. The method of claim 1, wherein said capacitor dielectric layer is composed of silicon oxide/silicon nitride/silicon oxide (ONO) having a thickness in the range from about 50 to 80 Angstroms.

11. The method of claim 1, wherein the thickness of said third polysilicon layer is between about 500 to 2000 Angstroms and is doped N-type having a concentration of between about 1 E 19 to 1 E 21 atoms/cm3.

12. A method for fabricating a dynamic random access memory having an array of high capacitance stacked capacitor on a semiconductor substrate comprising the steps of:

forming a patterned relatively thick field oxide on the principle surface of a semiconductor substrate while leaving device for fabrication of field effect transistors;

forming a gate oxide layer on said substrate in said device areas;

depositing a first polysilicon layer on said substrate;

depositing a first insulating layer on said first polysilicon layer; and patterning said first insulating layer and first polysilicon layer forming .gate electrodes structures in said device areas and patterned conducting layers elsewhere on said field oxide areas;

forming source/drain areas adjacent to and on both sides of said gate electrode structures; and forming insulating sidewall spacers on said gate electrode structures and on said patterned conducting layers; and then forming said stacked capacitor by, depositing a second insulating layer on said device areas and elsewhere over said substrate, etching self-aligning contact openings in said second insulating layer to one of said two source/-drain areas of said field effect transistors using a photoresist mask, depositing a second polysilicon layer on said substrate and contacting said source/drain areas in said contact openings, patterning said second polysilicon layer having portions remaining over said self-aligned contact and forming a bottom capacitor electrodes making contact to said source/drain areas, using said same photoresist mask of said contact openings to pattern and partially etch said bottom capacitor electrode forming ringed sidewalls on said bottom capacitor electrode, doping with impurities said bottom capacitor electrode by implantation, and thereby increasing the conductivity, and forming ohmic contact to said source/drain area, forming a capacitor dielectric layer on surface of said bottom capacitor electrode, depositing and patterning a third polysilicon layer over said capacitor dielectric layer on said substrate and forming a top capacitor electrode and completing said stacked capacitor.

13. The method of claim 12, wherein the thickness of said first polysilicon is between about 1000 to 3000 Angstroms.

14. The method of claim 12, wherein said first insulating layer is silicon oxide formed from a tetraethoxysilane (TEOS) having a thickness of between about 1000 to 2500 Angstroms.

15. The method of claim 12, wherein said second insulating layer is a silicon oxide formed from a tetraethoxysilane (TEOS) and having a thickness of between about 1000 to 3000 Angstroms.

16. The method of claim 12, wherein said self-aligned contact openings are formed using a photoresist mask and anisotropically etching said second insulating layer to said first insulating layer and said sidewall spacers.

17. The method of claim 12, wherein the thickness of said second polysilicon layer is between about 3000 to 5000 Angstroms.

18. The method of claim 12, wherein said bottom capacitor electrode ring-type sidewall is formed by partially and anisotropically etching said second polysilicon layer to a depth of between about 1000 to 4000 Angstroms.

19. The method of claim 12, wherein said capacitor dielectric layer is composed of silicon oxide/silicon nitride/silicon oxide (ONO) having a thickness in the range from about 50 to 80 Angstroms.

20. The method of claim 12, wherein said bottom capacitor electrode composed of said second polysilicon layer is doped N type having a concentration of between about 1 E 19 to 1 E 21 atoms/cm$^3$.

21. The method of claim 12, wherein said capacitor dielectric layer is composed of silicon oxide/silicon nitride/silicon oxide (ONO) having a thickness in the range from about 50 to 80 Angstroms.

22. The method of claim 12, wherein the thickness of said third polysilicon layer is between about 500 to 2000 Angstroms and is doped N-type having a concentration of between about 1 E 19 to 1 E 21 atoms/cm3.

* * * * *